(12) United States Patent
Li et al.

(10) Patent No.: US 12,527,205 B2
(45) Date of Patent: Jan. 13, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Pengfei Li, Hubei (CN); Hanchen Liu, Hubei (CN); Wenxu Xianyu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 468 days.

(21) Appl. No.: 17/758,133

(22) PCT Filed: Apr. 25, 2022

(86) PCT No.: PCT/CN2022/088963
§ 371 (c)(1),
(2) Date: Jun. 29, 2022

(87) PCT Pub. No.: WO2023/178787
PCT Pub. Date: Sep. 28, 2023

(65) Prior Publication Data
US 2024/0196699 A1    Jun. 13, 2024

(30) Foreign Application Priority Data
Mar. 22, 2022    (CN) .......................... 202210285415.2

(51) Int. Cl.
H10K 59/80    (2023.01)
(52) U.S. Cl.
CPC .................................. H10K 59/873 (2023.02)

(58) Field of Classification Search
CPC ....... H10K 59/873; H10K 59/00; H10K 50/80
See application file for complete search history.

(56) References Cited

U.S. PATENT DOCUMENTS

| 2019/0312226 | A1* | 10/2019 | Huang | ............... H10K 59/8731 |
| 2021/0408469 | A1* | 12/2021 | Ye | ......................... H10K 50/844 |
| 2022/0091449 | A1* | 3/2022 | Wang | ..................... G02F 1/0107 |

FOREIGN PATENT DOCUMENTS

| CN | 107170792 A | 9/2017 |
| CN | 108832022 A | 11/2018 |

(Continued)

OTHER PUBLICATIONS

Chinese Office Action issued in corresponding Chinese Patent Application No. 202210285415.2 dated Apr. 22, 2024, pp. 1-10.

(Continued)

*Primary Examiner* — Vongsavanh Sengdara
(74) *Attorney, Agent, or Firm* — PV IP PC; Wei Te Chung (57) ABSTRACT

The present application discloses a display panel and a display device, and relates to a technical field of display. In technical solutions of the present application, retaining wall arrays formed by arranging a plurality of retaining wall blocks are provided, and gaps formed by different arranged arrays in the retaining wall array extend in a direction away from the display area and are arranged in an alternating manner. Since the flowing organic materials need to first flow through different gaps that are arranged in an alternating manner, and then can move to edges of the peripheral area, flow path of the flowing organic materials in the peripheral area is prolonged, thereby reducing risk of the flowing organic materials crossing the dam wall in inkjet printing stage and risk of packaging failure of the display panel.

20 Claims, 5 Drawing Sheets

(56) References Cited

FOREIGN PATENT DOCUMENTS

| | | | |
|---|---|---|---|
| CN | 109728194 | A | 5/2019 |
| CN | 110993817 | A | 4/2020 |
| CN | 111063820 | A | 4/2020 |
| CN | 111463361 | A | 7/2020 |
| CN | 112083607 | A | 12/2020 |
| JP | 2004355910 | A | 12/2004 |
| WO | 2020177600 | A1 | 9/2020 |
| WO | 2021159584 | A1 | 8/2021 |

OTHER PUBLICATIONS

International Search Report in International application No. PCT/CN2022/088963, mailed on Dec. 15, 2022.
Written Opinion of the International Search Authority in International application No. PCT/CN2022/088963, mailed on Dec. 15, 2022.

* cited by examiner

DISPLAY PANEL AND DISPLAY DEVICE

TECHNICAL FIELD

The present application relates to a technical field of display, and in particular, to a display panel and a display device.

BACKGROUND

Organic electroluminescence display (OELD) technology plays an important role in display technology due to its advantages of flexibility, active luminescence, wide viewing angle, high contrast ratio and rapid response time.

After an existing OLED display panel completes an evaporation process, luminescent layer materials need to be packaged to avoid damage caused by water and oxygen invasion. At present, a mainstream process is to form a package structure by superimposing an inorganic layer and an organic layer, wherein the organic layer in the package structure is formed on an inorganic film layer by inkjet printing, and then is formed by UV curing. When printing, flowing organic materials will flow in a display area and a peripheral area of a display substrate of a display panel, and the flowing organic materials will easily cross a dam wall in the peripheral area, which will lead to packaging failure due to materials overflow. This problem is particularly obvious when the display panel is designed with a narrow frame and a leveling area of the flowing organic materials is short.

Technical Problem

A technical problem to be solved by the present application is to provide a display panel capable of reducing risk of flowing organic materials crossing the dam wall.

Technical Solution

Technical solutions adopted by the present application to solve the above technical problem are as follows:

In a first aspect, the present application provides a display panel comprising:

- a display substrate formed with a display area and a peripheral area formed at least outside one side of the display area; and
- a retaining wall portion disposed in the peripheral area, wherein the retaining wall portion comprises a dam wall and retaining wall arrays, the dam wall is located on one side of the retaining wall arrays away from the display area, the retaining wall arrays comprise at least two groups of arranged arrays disposed at intervals sequentially in a direction away from the display area, each of the arranged arrays is formed by a plurality of retaining wall blocks disposed sequentially, gaps extending in a direction away from the display area are formed between two adjacent retaining wall blocks, and the gaps in the at least two groups of arranged arrays are arranged in an alternating manner.

Optionally, in some embodiments of the present application, the retaining wall blocks comprise at least first retaining wall blocks and second retaining wall blocks, the arranged arrays arranged arrays comprise a first arranged array formed by a plurality of the first retaining wall blocks disposed sequentially, and a second arranged array formed by a plurality of the second retaining wall blocks disposed sequentially, the first arranged array and the second arranged array are sequentially disposed in a direction away from the display area, the gaps comprise first gaps formed between two adjacent first retaining wall blocks, and second gaps formed between two adjacent second retaining wall blocks, and the first gaps and the second gaps are arranged in an alternating manner.

Optionally, in some embodiments of the present application, a width of the first gap gradually reduces in a direction away from the display area.

Optionally, in some embodiments of the present application, at least one of two adjacent side edges of two first retaining wall blocks facing each other is progressively approaching the other in a direction away from the display area and extends in a straight line.

Optionally, in some embodiments of the present application, side edges of the first retaining wall block adjacent to the first retaining wall block on both sides thereof are first side edges and second side edges, respectively.

Optionally, in some embodiments of the present application, at least a part of the first retaining wall blocks, the first side edge and the second side edge are connected, and the first side edge and the second side edge extend away from each other from a portion where they are connected in a direction away from the display area.

Optionally, in some embodiments of the present application, a part of the first retaining wall blocks has a triangular cross section perpendicular to a positive direction.

Optionally, in some embodiments of the present application, at least a part of the first retaining wall blocks, the first side edge and the second side edge are connected by a first straight edge disposed therebetween, and the first side edge and the second side edge extend away from each other from portions where they are connected with the first straight edge in a direction away from the display area.

Optionally, in some embodiments of the present application, at least a part of the first retaining wall blocks has a trapezoidal cross section perpendicular to a positive direction.

Optionally, in some embodiments of the present application, a width of the second gap gradually increases in a direction away from the display area.

Optionally, in some embodiments of the present application, at least one of two adjacent side edges of two second retaining wall blocks facing each other is progressively away from the other in a direction away from the display area and extends in a straight line.

Optionally, in some embodiments of the present application, side edges of the second retaining wall block adjacent to the second retaining wall block on both sides thereof are third side edges and fourth side edges, respectively; and in at least a part of the first retaining wall blocks, the third side edge and the fourth side edge are connected by a second straight edge disposed therebetween, and the third side edge and the fourth side edge extend toward each other from portions where they are connected with the second straight edge in a direction away from the display area.

Optionally, in some embodiments of the present application, at least a part of the second retaining wall blocks has a triangular cross section perpendicular to a positive direction.

Optionally, in some embodiments of the present application, at least a part of the second retaining wall blocks has a trapezoidal cross section perpendicular to a positive direction.

Optionally, in some embodiments of the present application, the peripheral area surrounds the display area, and the arranged arrays surround the display area.

Optionally, in some embodiments of the present application, the display area is defined by a plurality of edges sequentially disposed, the arranged arrays are divided into a plurality of edge columns sequentially disposed in a direction surrounding the display area and corresponding to the edges of the display area, the retaining wall blocks in each of the edge columns are sequentially disposed in a direction extending along the corresponding edges of the display area, the retaining wall portions further comprise flow blocking structures, and the flow blocking structures are disposed between the retaining wall blocks closest to each other in two adjacent edge columns.

Optionally, in some embodiments of the present application, the flow blocking structure has a circular cross section perpendicular to a positive direction.

In a second aspect, the present application provides a display device comprising the display panel according to the first aspect.

TECHNICAL EFFECTS

Compared with the prior art, the present application has the following advantages:

The display panel provided by the present application is mainly provided with retaining wall arrays formed by disposing a plurality of retaining wall blocks, and gaps formed by different arranged arrays in the retaining wall arrays extend in a direction away from the display area and are arranged in an alternating manner. Compared with conventional manner, since the flowing organic materials need to first flow through different gaps that are arranged in an alternating manner, and then can move to edges of the peripheral area, flow path of the flowing organic materials in the peripheral area is prolonged, so that final flow cut-off positions of the flowing organic materials are easily to be located within the dam wall, thereby reducing risk of the flowing organic materials crossing the dam wall in inkjet printing stage and risk of packaging failure of the display panel.

BRIEF DESCRIPTION OF THE DRAWINGS

In order to more clearly describe the technical solutions in embodiments of the present application or technical solutions in the prior art, hereinafter, the appended drawings used for describing the embodiments will be briefly introduced. The appended drawings described below are only directed to some embodiments of the present application, and for a person skilled in the art, without expenditure of creative labor, other drawings can be derived on the basis of these appended drawings.

DESCRIPTION OF REFERENCE NUMBERS

10—display substrate, 11—display area, 12—peripheral area: 21—dam wall, 22—first arranged array, 221—first retaining wall block, 221*a*—first side edge, 221*b*—second side edge, 221*c*—first straight edge, 221*d*—first gap, 23—second arranged array, 231—second retaining wall block, 231*a*—third side edge, 231*b*—fourth side edge, 231*c*—second straight edge, 231*d*—second gap, 24—edge column, 25—flow blocking structure, 26—organic film layer.

DETAILED DESCRIPTION

Embodiments

Hereinafter, technical solutions in embodiments of the present application will be clearly and completely described with reference to the accompanying drawings in embodiments of the present application. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

In description of the present application, it should be understood that the terms "center", "longitudinal", "horizontal", "length", "width", "thickness", "upper", "lower", "before", "after", "left", "right", "vertical", "horizontal", "top", "bottom", "inner", "outer" etc., that indicating an orientation or a positional relationship are based on an orientation or a positional relationship shown in the accompanying drawings, which are merely intended to facilitate the description of the present application and simplify the description, and are not intended to indicate or imply that a device or an element must have a specific orientation, be constructed and operated in a specific orientation, and therefore cannot be construed as a limitation of the present application. In addition, the terms "first", "second" are used for descriptive purposes only and cannot be understood as indicating or implying relative importance or implicitly indicating the number of indicated technical features. Thus, the features defined by "first" and "second" may explicitly or implicitly include one or more features. In description of the present application, "a plurality of" means two or more, unless specifically limited otherwise.

In the present application, the term "exemplary" means "used as an example, illustration, or description". Any embodiments described as exemplary in the present application are not necessarily interpreted as being more preferred or advantageous than other embodiments. In order to enable any person skilled in the art to realize and use the present application, the following description is given. In the following description, details are given for purposes of explanation. It should be understood that a person skilled in the art may recognize that the present application may be implemented without using these specific details. In other instances, known structures and processes are not described in detail to avoid unnecessary details obscuring the description of the present application. Accordingly, the present application is not intended to be limited to the illustrated embodiments, but is to be corded the widest scope consistent with the principles disclosed herein.

Embodiment 1

A main body of this embodiment is a display panel, specifically an OLED display panel, but is not limited thereto. The display panel may be any display panel that requires inkjet printing of an organic film layer to form a package structure, which is not particularly limited herein.

Figure 1:
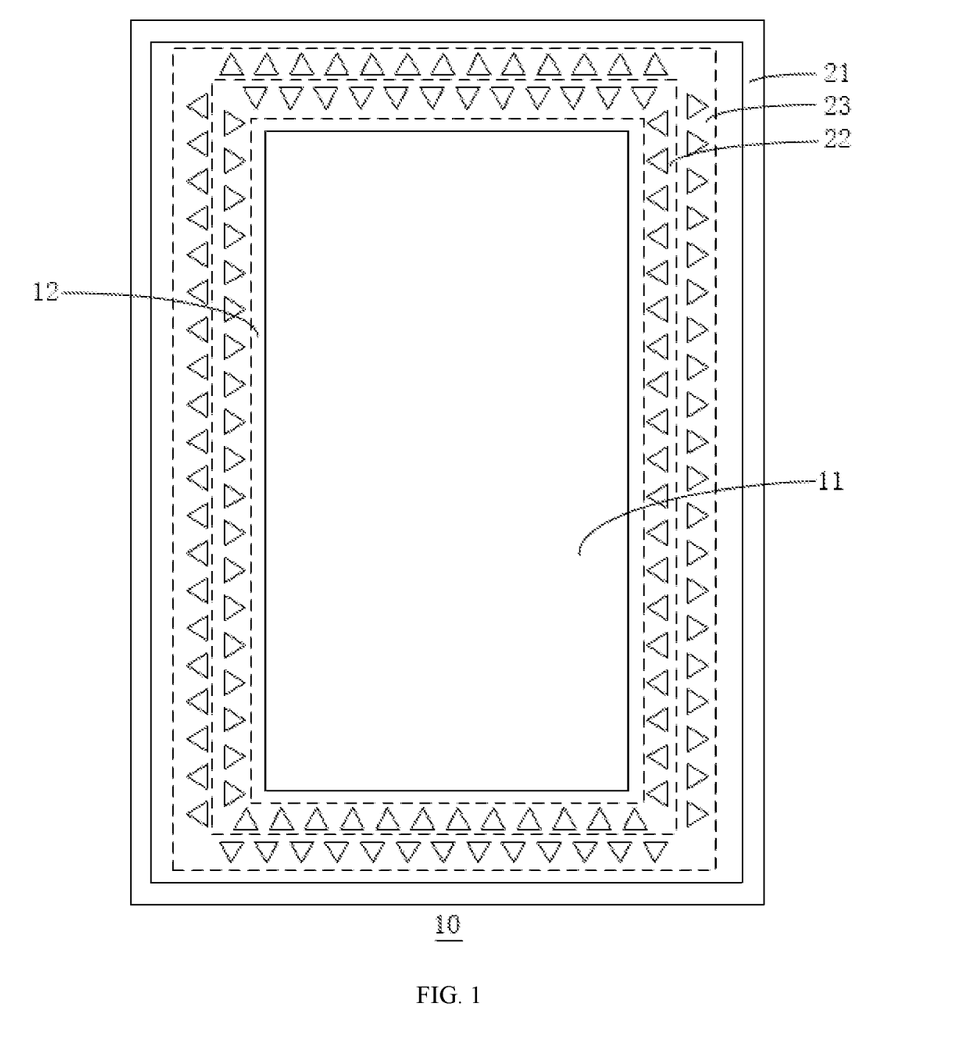
FIG. 1 is a schematic structural diagram of a display substrate according to Embodiment 1 of the present application.
Figure 2:
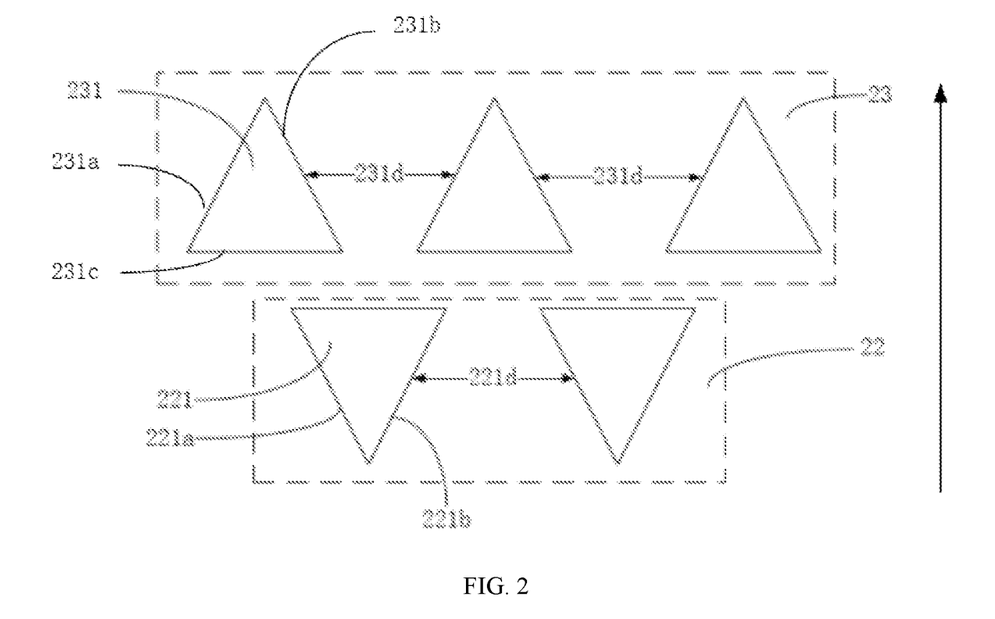
FIG. 2 is a partial structural diagram of a first arranged array and a second arranged array according to Embodiment 1 of the present application.

Referring to FIGS. 1 and 2, in this embodiment, the display panel comprises:
- a display substrate 10 formed with a display area 11 and a peripheral area 12 formed at least outside one side of the display area 11; and
- a retaining wall portion disposed in the peripheral area 12, wherein the retaining wall portion comprises a dam wall 21 and retaining wall arrays formed by arranging a plurality of retaining wall blocks, the dam wall 21 is located on one side of the retaining wall arrays away from the display area 11, the retaining wall arrays comprise at least two groups of arranged arrays disposed sequentially in a direction away from the display area 11, gaps extending in a direction away from the display area are formed between two adjacent retaining wall blocks in each of the arranged arrays, and the gaps in the at least two groups of arranged arrays are arranged in an alternating manner.

Figure 4:
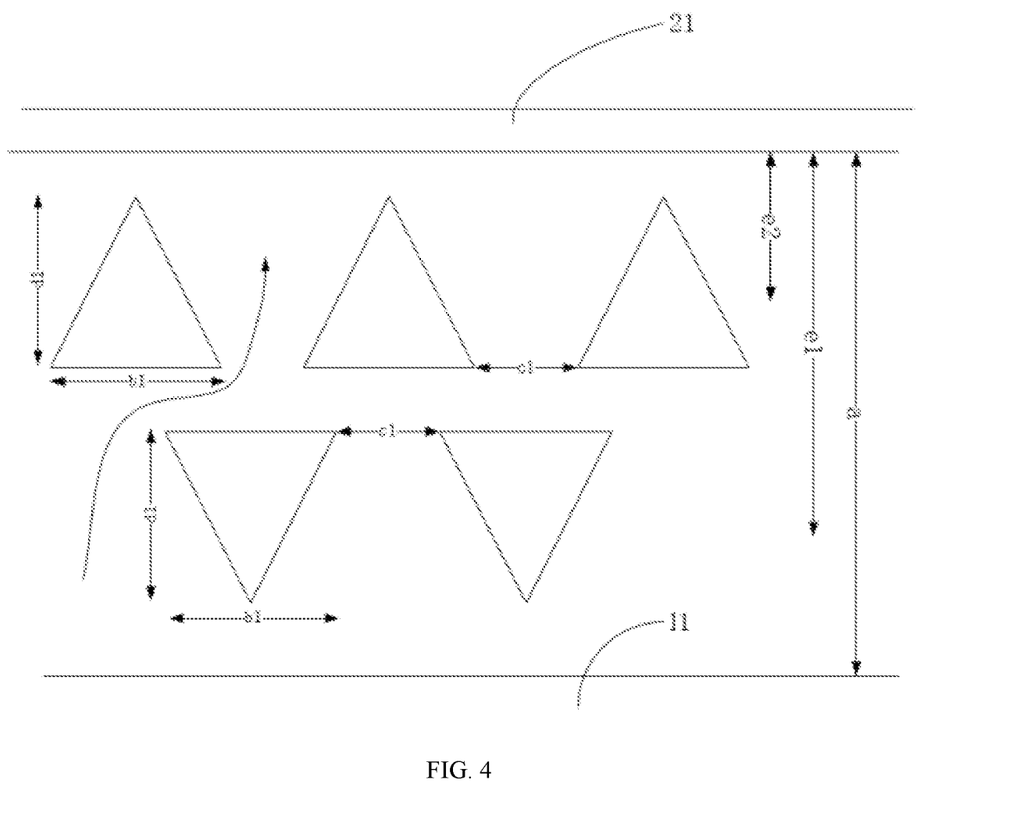
FIG. 4 is a schematic diagram of a positional relationship between a first arranged array and a second arranged array according to Embodiment 1 of the present application.

In the process of forming an organic film layer by subjecting the above-mentioned display substrate 10 to inkjet printing, thereby constituting a package structure, flowing organic materials will enter the peripheral area 12 from the display area 11, and generally flow in a direction away from the display area 11. Referring to FIG. 1, since each of the arranged arrays in the retaining wall arrays is disposed sequentially in a direction away from the display area 11. As a result, the flowing organic materials will pass through the gaps formed by the retaining blocks in each of the arranged arrays and eventually reaches vicinity of the dam wall 21. Referring to FIGS. 2 and 4, in which a curved line with an arrow refers to a flow path of the flowing organic materials, and a straight line with an arrow refers to a direction away from the display area 11. When the flow organic materials are passing through gaps formed by the retaining wall blocks in different arranged arrays, since the gaps formed by retaining wall blocks in different arranged arrays are arranged in an alternating manner, flow paths of the flowing organic materials are in zigzag shapes, which will increase length of the flow path of the flowing organic material, thereby making it easier for final flow cut-off positions of the flowing organic materials to be within the dam wall 21, thereby reducing risk of the flowing organic materials crossing the dam wall 21 in inkjet printing stage and risk of packaging failure of the display panel, which is especially suitable for the case where the display panel adopts a narrow frame design and the peripheral area 12 is short.

Figure 7:
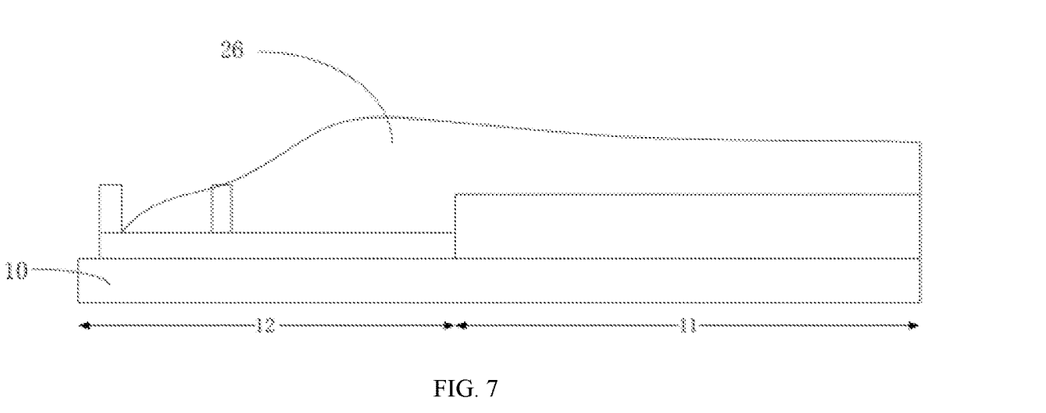
FIG. 7 is a schematic diagram of defects of an organic film layer in a conventional manner.

In addition, referring to FIG. 7, in the conventional manner, since flow performances of the flowing organic materials in the display area 11 and the peripheral area 12 are different, the organic film layer 26 formed by the flowing organic materials in the peripheral area 12 is generally thicker and forms a protrusion on one side close to the display area 11, and is thinner on one side away from the display area 11, which will affect optical performance of the package structure and subsequent process. The flow path of the flowing organic materials can be prolonged by the retaining wall arrays, furthermore, gaps of the frontmost arranged array can play a certain role in drainage, and gaps of the rear arranged array are arranged in an alternating manner, flow of the flowing organic materials can be limited, so as to prevent the organic film layer 26 from forming a protrusion on one side close to the display area 11 or its edge from being thin, thereby effectively improving molding effect of the organic film layer 26.

The above-mentioned display area 11 refers to an area in the display substrate 10 where light-luminescence display is correspondingly performed, and the above-mentioned peripheral area 12 refers to an area around the display area 11. In this embodiment, the display area 11 is surrounded by the peripheral area 12. It should be noted that this should not be construed as a limitation on positions of the display area 11 and the peripheral area 12, and the peripheral area 12 may exist only on one side or on any of several sides of the display area 11.

It should also be noted that an implementer can choose the number of arranged arrays included in the above-mentioned retaining wall arrays according to his/her own needs, so long as the gaps formed by two arranged arrays are arranged in an alternating manner, flow path of the flowing organic materials crossing the retaining wall arrays will no longer be straight, and the flow path of the flowing organic materials can be prolonged.

More specifically, in this embodiment, the display substrate 10 is specifically an array substrate, and it may also be a structure such as a glass cover plate in which a package structure needs to be provided. The above-mentioned dam wall 21 has a closed shape surrounding the display area 11 and the number thereof is one, but the number of dam walls 21 and shape of the dam walls 21 are not limited thereto. Without prejudice to purpose of the present invention, an implementer can choose the number of dam walls 21 and shapes thereof. For example, in another embodiment, the number of dam walls 21 described above is two and the dam walls 21 are in non-closed shapes.

Referring to FIG. 2, in order to simplify arrangement of the retaining wall arrays, in this embodiment, the retaining wall blocks comprise first retaining wall blocks 221 and second retaining wall blocks 231, the arranged arrays comprise a first arranged array 22 formed by a plurality of the first retaining wall blocks 221 disposed sequentially, and a second arranged array 23 formed by a plurality of the second retaining wall blocks 231 disposed sequentially, and the first arranged array 22 and the second arranged array 23 are sequentially disposed in a direction away from the display area 11.

That is to say, two groups of arranged arrays are mainly provided in this embodiment to respectively form two different gaps that are arranged in an alternating manner, so as to achieve purpose of prolonging flow path of the flowing organic materials. The technical solution provided by this embodiment is easier to implement than technical solutions of disposing more arrays.

It should be noted here that the gaps comprise first gaps 221d formed between two adjacent first retaining wall blocks 221, and second gaps 231d formed between two adjacent second retaining wall blocks 231, and the first gaps 221d and the second gaps 231d are arranged in an alternating manner. However, it should not be understood that the first arranged array 22 and the second arranged array 23 must be disposed adjacent to each other. As described above, for the first arranged array 22 and the second arranged array 23, there may be other arrays therebetween and there outside, as long as the first gaps 221d and the second gaps 231d are arranged in an alternating manner.

In addition, as described above, since flow performances of the flowing organic materials in the display area 11 and the peripheral area 12 are different, the organic film layer 26 formed by the flowing organic materials in the peripheral area 12 is generally thicker and forms a protrusion on one side close to the display area 11, and is thinner on one side away from the display area 11. Accordingly, referring to FIGS. 2 and 4 again, in the embodiment, a width of the first gap 221d gradually reduces in a direction away from the display area 11.

As the width of the first gap 221d gradually reduces, flow rate of the flowing organic materials will gradually increase in the process of passing through the first gaps 221d, which will reduce risk of the flowing organic materials stacking at the first gaps 221d. However, since the first gaps 221d are located on one side close to the display area 11 in the whole retaining walls, risk of the organic film layer 26 forming a protrusion on one side close to the display area 11 can be effectively reduced. Here, it should be noted that those skilled in the art can understand that a width direction of the first gap 221d refers to a direction perpendicular to an extending direction and a positive direction of the first gap 221d. The positive direction here refers to a direction perpendicular to the display substrate 10.

In addition, an implementer may adjust the shape and height of the first retaining wall block 221 as required. However, if it is desired that the width of the first gap 221d gradually reduces in a direction away from the display area 11, at least one of two adjacent side edges of two first retaining wall blocks 221 facing each other extends progressively approaching the other in a direction away from the display area 11. Ideally, as shown in this embodiment, two side edges of two adjacent first retaining wall blocks 221 facing each other extend in a straight line in a direction away from the display area 11. That is to say, both side edges defining the first gap 221d are straight side edges, which can facilitate molding of the first retaining wall blocks 221.

Figure 3:
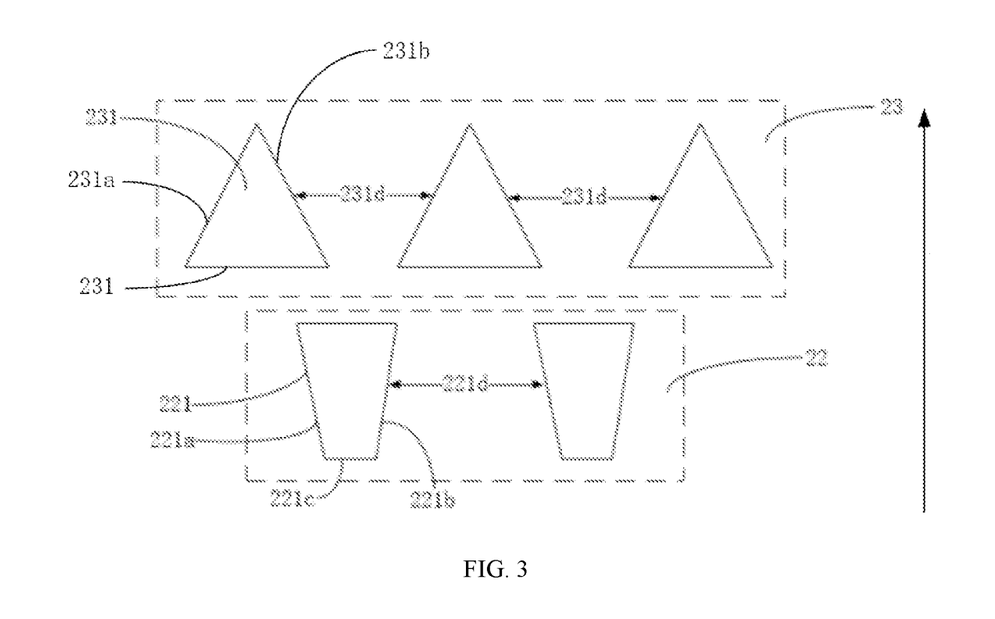
FIG. 3 is a partial structural diagram of a first arranged array and a second arranged array according to another embodiment of the present application.

More specifically, referring to FIGS. 2 and 3, side edges of the first retaining wall block 221 adjacent to the first retaining wall block 221 on both sides thereof are first side edges 221a and second side edges 221b, respectively.

In at least a part of the first retaining wall blocks 221, the first side edge 221a and the second side edge 221b are connected, and the first side edge 221a and the second side edge 221b extend obliquely away from each other from a portion where they are connected in a direction away from the display area 11; and/or in at least a part of the first retaining wall blocks 221, the first side edge 221a and the second side edge 221b are connected by a first straight edge 221c disposed therebetween, and the first side edge 221a and the second side edge 221b extend obliquely away from each other from portions where they are connected with the first straight edge 221c in a direction away from the display area 11.

That is to say, a part of the first retaining wall blocks 221 may be formed with a corner end structure that directly connects the first side edge 221a and the second side edge 221b, and a part of the first retaining wall blocks 221 may also be formed with a trapezoidal corner end structure that connects the first side edge 221a and the second side edge 221b through the first straight edge 221c. With this arrangement, it is possible to further improve diversion and drainage effects of the flowing organic materials at the first arranged array 22, reduce fluidity loss of the flowing organic materials, and reduce risk of the flowing organic materials forming a protrusion at one side of the peripheral area 12 close to the display area 11.

It should be noted that the first retaining wall block 221 may be disposed by an implementer to have a triangular cross section perpendicular to a positive direction as shown in this embodiment, but this should not be understood to mean that when the first retaining wall block 221 has a corner end structure as described above, the cross-section of the first retaining wall block 221 must be triangular and the first side edge 221a and the second side edge 221b must be straight side edges. The first retaining wall block 221 may be of any shape including a corner end structure, and the first side edge 221a and the second side edge 221b may also be arcuate edges, so long as the first retaining wall block 221 can have the corner end structure as described above, that is, the diversion effect of the first retaining wall block 221 can be improved.

It should also be noted that, for the first retaining wall block 221 in the first arranged array 221, a part of the first retaining wall blocks 221 may have the corner end structure as described above, and a part of the first retaining wall blocks 221 has the trapezoidal end as described above, or all of the first retaining wall blocks 221 may have the trapezoidal end as described above in another embodiment as shown in FIG. 4, or all of the first retaining wall blocks 221 may have the triangular cross-section perpendicular to the positive direction as shown in this embodiment, or all of the first retaining wall blocks 221 may have the corner end structure as described above, which is not particularly limited in the present application.

Furthermore, as described above, the organic film layer 26 formed by the flowing organic materials in the peripheral area 12 is substantially thicker and forms a protrusion on one side close to the display area 11, and is thinner on one side away from the display area 11. The problem of forming a protrusion close to the display area 11 can be effectively improved by improving widths of the first gaps 221d. In response to the problem that the organic film layer 26 formed after curing of the flowing organic materials is thinner on one side away from the display area 11, please refer to FIGS. 2 and 4 again, in this embodiment, width of the second gap 231d gradually increases in a direction away from the display area 11. By increasing the width of the second gap 231d, flow rate of the flowing organic materials can be gradually slowed down to a certain extent. Meanwhile, since the second arranged array 23 formed by the second retaining wall blocks 231 is located outside the first arranged array 22, it is possible to effectively improve the problem that thickness of the film layer formed by the flowing organic materials on one side of the peripheral area 12 away from the display area 11 is thin.

Similar to the structure described above, in this embodiment, at least one of two adjacent sides of two second retaining wall blocks 231 facing each other is progressively away from the other in a direction away from the display area 11 and extends in a straight line. That is to say, both side edges defining the second gaps 231d have straight edge shapes, and this arrangement can facilitate molding of the second retaining wall blocks 231.

In detail, in this embodiment, side edges of the second retaining wall block 231 adjacent to the second retaining wall block 231 on both sides thereof are third side edges 231a and fourth side edges 231b, respectively. In at least a part of the first retaining wall blocks 231, the third side edge 231a and the fourth side edge 231b are connected by a second straight edge 231c disposed therebetween, and the third side edge 231a and the fourth side edge 231b extend toward each other from portions where they are connected with the second straight edge 231c in a direction away from the display area 11 to facilitate molding of the second retaining wall blocks 231. More specifically, in this embodiment, the cross-section of the second retaining wall blocks 231 perpendicular to the positive direction is triangular, and the top corner portion thereof is directed to one side away from the display area 11. Certainly, the second retaining wall blocks 231 may be disposed by an implementer such that the cross-section perpendicular to the positive direction is a trapezoid with a smaller end pointing to one side away from the display area 11.

Specific dimensions of components in the display panel provided in this embodiment will be further described below. Referring to FIG. 4, in this embodiment, the shapes and dimensions of the first retaining wall block 221 and the second retaining wall blocks 231 are the same. A distance between center of the first arranged array 22 and the dam wall 21 is e1, a distance between center of the second arranged array 23 and the dam wall 21 is e2, and a distance between edges of the display area 11 and the dam wall 21 is a, which is a dimension of the leveling area. B1 is a width dimension of the first retaining wall block 221 and the second retaining wall block 231, and d1 is a length dimension of the first retaining wall block 221 and the second retaining wall block 231 in the direction away from the display area 11. A dimension of e2 can range from (d1/2+10) μm to a/2, and a dimension of e1-e2-d1 can be selected from 5 μm to 1200 μm. A dimension of b1 ranges from 1 μm to 1200 μm, and a dimension of c1 ranges from 1 μm to 1200 μm. An implementer may select them without affecting purpose of the present invention and without interference. It should be noted here that when the first retaining wall block 221 has a trapezoidal end as described above, and the first retaining wall block 221 and the second retaining wall block 231 have a trapezoidal cross-section perpendicular to the positive direction, a ratio of lengths of the smaller end and the larger end of the first retaining wall block 221 and the second retaining wall block 231 may be selected from 0.1 to 0.9.

Furthermore, regarding molding step of the retaining wall array, in this embodiment, in the manufacturing process of the array substrate, in the peripheral area 12, a mask is applied for patterning to form the retaining wall array. Certainly, on the premise of not affecting purpose of the present invention, an implementer can also use other processes such as evaporation to form the above-mentioned retaining wall array.

Embodiment 2

Figure 5:
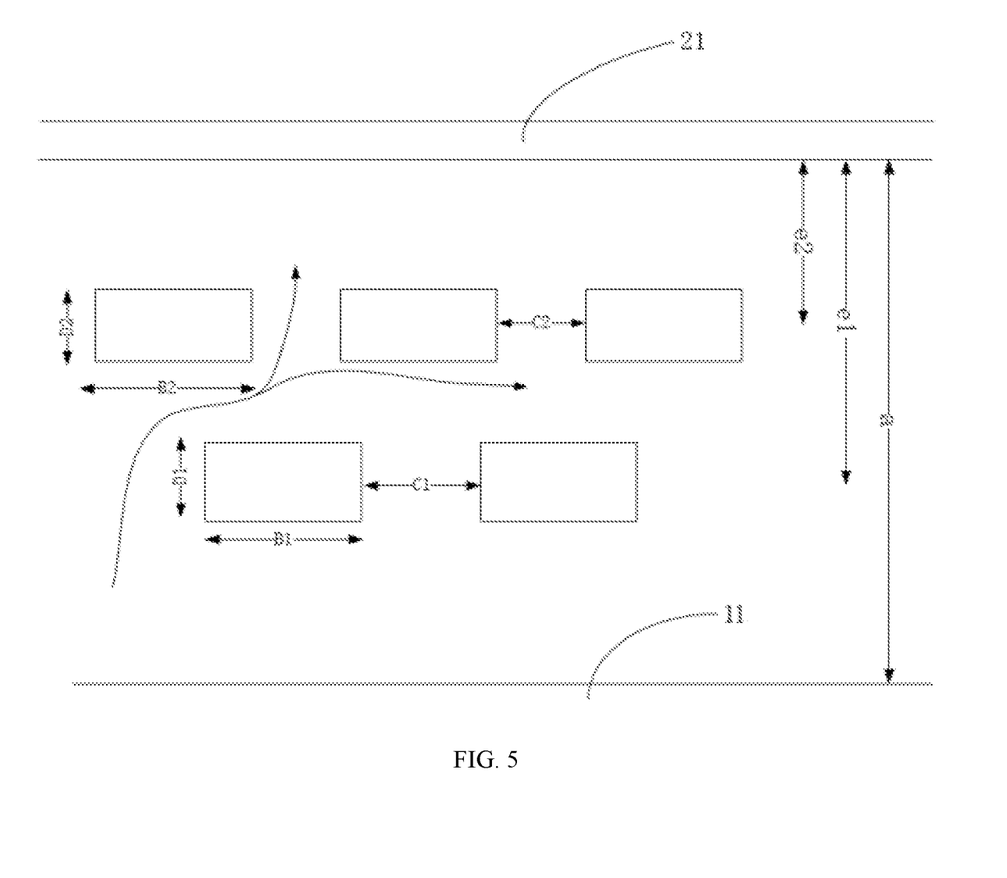
FIG. 5 is schematic diagram of a positional relationship between a first arranged array and a second arranged array according to Embodiment 2 of the present application.

Embodiment 2 provides a display panel. Referring to FIG. 5, this embodiment differs from embodiment 1 in that, in embodiment 2, both cross sections of the first retaining wall block 221 and the second retaining wall block 231 perpendicular to the positive direction are rectangular, so as to facilitate molding of the first retaining wall block 221 and the second retaining wall block 231.

Specific dimensions of components in the display panel provided in this embodiment will be further described below. In this embodiment, B1 is width of the first retaining wall block 221 in the first arranged array, D1 is a dimension of the first retaining wall block 221 in the direction away from the display area 11, B2 is width of the second retaining wall block 231 in the second arranged array, D2 is width of the second retaining wall block 231 in the direction away from the display area 11, C1 is a spacing between two adjacent first retaining wall blocks 221 in the first arranged array, and C2 is a spacing between two adjacent second retaining wall blocks 231 in the second arranged array. Wherein a spacing between the first arranged array 22 and the dam wall 21 is e1, a spacing between the second arranged array 23 and the dam wall 21 is e2, and e1 and e2 may be selected to have the same numerical range as e1 and e2 in embodiment 1. In addition, range of B2 may be selected from 29 μm to 1200 μm, and D2 is equal to or less than B2; range of B1 may be selected from (B2−10 μm) to B2/2, and D1 is equal to or less than B1; and range of C1 is from 1 μm to 1200 μm, and C2 is equal to or less than C1. An implementer may select them without affecting purpose of the present invention and without interference.

Embodiment 3

Figure 6:
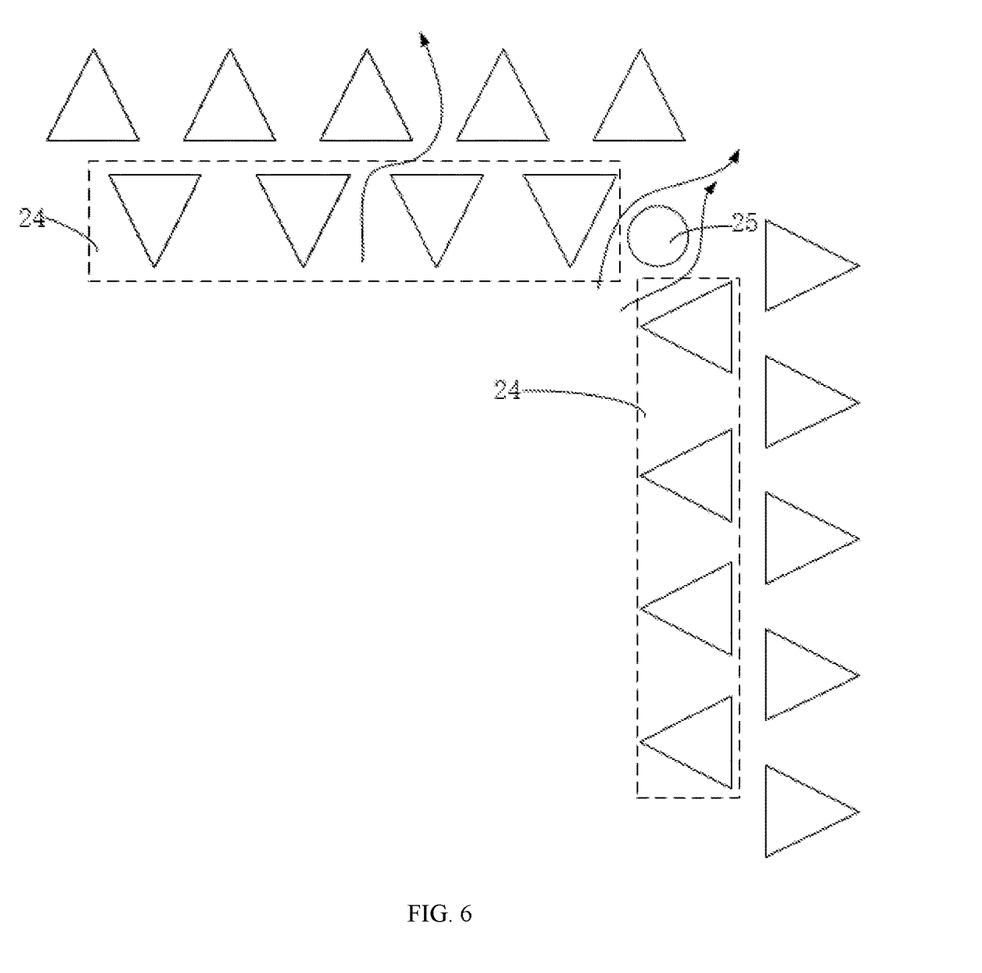
FIG. 6 is a schematic diagram of position of a flow blocking structure according to Embodiment 3 of the present application.

Embodiment 3 provides a display panel, and technical solution provided by this embodiment is substantially the same as that of embodiment 1. Referring to FIGS. 1 and 6, for the technical solution provided in embodiment 1, since the display area 11 is mainly defined by a plurality of edges sequentially connected at an included angle, the first arranged array 22 or the second arranged array 23 may be divided into a plurality of edge columns 24 corresponding to side edges of the display area 11. At an intersection of two adjacent edge columns 24, that is, outside of diagonal of the display area 11, flow path of the flowing organic materials may have a straight extending shape, and length of which is short, and the flowing organic materials are easy to overflow at corners of the dam wall 21.

Therefore, referring to FIG. 7, a schematic diagram of the arranged array disposed at a diagonal position. In this embodiment, the arranged arrays are divided into a plurality of edge columns 24 sequentially disposed in a direction surrounding the display area 11 and corresponding to the edges of the display area 11. The retaining wall portions further comprise flow blocking structures 25, and the flow blocking structures 25 are disposed between the retaining wall blocks closest to each other in two adjacent edge columns 24.

When passing through the flow blocking structures 25, the flowing organic materials will flow along outer walls of the flow blocking structures 25, and lengths of the flow path will be lengthened, so that the flowing organic materials have a tendency to move toward two edge columns 24, thus weakening tendency of the flowable organic materials flowing in a diagonal direction. It is desirable that the flow blocking structures 25 are disposed to have a circular cross-section perpendicular to the positive direction, wherein peripheral surfaces of the flow blocking structures 25 can effectively reduce fluidity loss of the flowing organic materials and prevent the flowing organic materials from accumulating at the flow blocking structures 25, which is particularly suitable for the case where the flowing organic materials have a high viscosity.

Embodiment 4

Embodiment 4 provides a display device comprising a display panel as described in any of embodiments 1, 2, or 3, and the display device may be any display device such as a tablet computer, VR, a mobile phone, or a notebook computer.

Basic concepts have been described above, it is obvious to those skilled in the art that the above detailed disclosure is merely exemplary and does not constitute a limitation to the present application. Although not expressly stated herein, those skilled in the art may make various modifications, improvements and amendments to the present application. Such modifications, improvements and amendments are proposed in the present application, so they still fall within the spirits and scopes of the exemplary embodiments of the present application.

Meanwhile, in the present application, specific words are used to describe embodiments of the present application. Such as "one embodiment", "an embodiment," and/or "some embodiments" means features, structures, or characteristics associated with at least one embodiment of the present application. Therefore, it should be emphasized and noted that "one embodiment" or "an embodiment" or "an alternative embodiment" mentioned twice or more in different positions in the specification does not necessarily mean the same embodiment. Furthermore, some features, structures or features in one or more embodiments of the present application may be combined appropriately.

Similarly, it should be noted that, in order to simplify description of the disclosure of the present application and thereby facilitating understanding of one or more of embodiments in the present application, various features are sometimes incorporated into one embodiment, drawings, or descriptions thereof in the foregoing description of embodiments in the present application. However, this disclosure method does not mean that subject of the present application requires more features than those mentioned in the claims. In fact, features of the embodiments are less than the overall features of an individual embodiment disclosed above.

Numbers describing the number of components and attributes are used in some embodiments, and it should be understood that such numbers are used for description of embodiments, and in some examples modifiers "about", "approximately" or "substantially" are used. Unless otherwise stated, "about", "approximately" or "substantially" indicates that the number is allowed to vary by ±%. Accordingly, in some embodiments, the numerical parameters used in the specification and claims are approximate values that may vary depending on desired characteristics of an individual embodiment. In some embodiments, specified significant digits should be taken into account for numerical parameters, and a method of general digit retention should be adopted. Although the numerical ranges and parameters used in some embodiments of the present application to confirm their breadth are approximate values, in specific embodiments, set of such values is as accurate as possible. within feasible range.

Each of the patents, patent applications, patent application publications, and other materials, such as articles, books, specifications, publications, documents, etc. cited in the present application are hereby incorporated by reference as a whole, except for historical documents of application which are inconsistent with or conflict with contents of the present application and for which the widest scope of claims in the present application is limited (currently or hereafter attached to the present application). It should be noted that, if there is any inconsistency or conflict between the descriptions, definitions and/or terms used in the supplementary materials of the present application and contents of the present application, descriptions, definitions and/or terms used in the present application shall prevail.

What is claimed is:

1. A display panel, comprising:
a display substrate formed with a display area and a peripheral area formed at least outside one side of the display area; and
a retaining wall portion disposed in the peripheral area, wherein the retaining wall portion comprises a dam wall and retaining wall arrays, the retaining wall arrays are located between the display area and the dam wall, the retaining wall arrays comprise at least a first retaining wall array and a second retaining wall array disposed at intervals, the first retaining wall array and the second retaining wall array are disposed sequentially in a direction away from the display area, the first retaining wall array is formed by a plurality of first retaining wall blocks disposed at intervals sequentially, the second retaining wall array is formed by a plurality of second retaining wall blocks disposed at intervals sequentially, first gaps extending in a direction away from the display area are formed between any two adjacent ones of the plurality of first retaining wall blocks, second gaps extending in a direction away from the display area are formed between any two adjacent ones of the plurality of second retaining wall blocks, and each of the first gaps and each of the second gaps are arranged in an alternating manner;
wherein a width of each of the first gaps reduces and a width of each of the second gaps increases in the direction away from the display area.

2. The display panel of claim 1, wherein at least one of two adjacent side edges of two adjacent ones of the plurality of the first retaining wall blocks facing each other is approaching the other in a direction away from the display area so that the width of one of the first gaps reduces and extends in a straight line.

3. The display panel of claim 1, wherein side edges of one of the plurality of the first retaining wall blocks adjacent to another one of the plurality of the first retaining wall blocks on both sides thereof are first side edge and second side edge, respectively.

4. The display panel of claim 3, wherein in at least a part of the first retaining wall blocks, the first side edge and the second side edge are connected, and the first side edge and the second side edge extend away from each other from a portion where they are connected in a direction away from the display area.

5. The display panel of claim 4, wherein an orthographic projection of at least one of the first retaining wall blocks in a direction perpendicular to the display substrate is a triangle.

6. The display panel according to claim 3, wherein in at least a part of the first retaining wall blocks, the first side edge and the second side edge are connected by a first straight edge disposed therebetween, and the first side edge and the second side edge extend away from each other from portions where they are connected with the first straight edge in a direction away from the display area.

7. The display panel of claim 6, wherein an orthographic projection of at least one of the first retaining wall blocks in a direction perpendicular to the display substrate is a trapezoid.

8. The display panel of claim 1, wherein at least one of two adjacent side edges of two second retaining wall blocks facing each other is away from the other in a direction away from the display area so that the width of one of the second gaps increases and extends in a straight line.

9. The display panel of claim 1, wherein side edges of the second retaining wall block adjacent to the second retaining wall block on both sides thereof are third side edges and fourth side edges, respectively; and in at least a part of the first retaining wall blocks, the third side edge and the fourth side edge are connected by a second straight edge disposed therebetween, and the third side edge and the fourth side edge extend toward each other from portions where they are connected with the second straight edge in a direction away from the display area.

10. The display panel of claim 9, wherein an orthographic projection of at least one of the second retaining wall blocks in a direction perpendicular to the display substrate is a triangle.

11. The display panel of claim 9, wherein an orthographic projection of at least one of the second retaining wall blocks in a direction perpendicular to the display substrate is a trapezoid.

12. The display panel of claim 1, wherein the peripheral area surrounds the display area, and the arranged arrays surround the display area.

13. The display panel according to claim 12, wherein the display area is defined by a plurality of edges sequentially disposed, the arranged arrays are divided into a plurality of edge columns sequentially disposed in a direction surrounding the display area and corresponding to the edges of the display area, the retaining wall blocks in each of the edge columns are sequentially disposed in a direction extending along the corresponding edges of the display area, the retaining wall portions further comprise flow blocking structures, and the flow blocking structures are disposed between the retaining wall blocks closest to each other in two adjacent edge columns.

14. The display panel of claim 13, wherein the flow blocking structure has a circular cross section.

15. A display device comprising the display panel according to claim 1, wherein the display panel comprises:

a display substrate formed with a display area and a peripheral area formed at least outside one side of the display area; and a retaining wall portion disposed in the peripheral area, wherein the retaining wall portion comprises a dam wall and retaining wall arrays, the dam wall is located on one side of the retaining wall arrays away from the display area, the retaining wall arrays comprise at least a first retaining wall array and a second retaining wall array disposed at intervals, the first retaining wall array and the second retaining wall array are disposed sequentially in a direction away from the display area, the first retaining wall array is formed by a plurality of first retaining wall blocks disposed at intervals sequentially, the second retaining wall array is formed by a plurality of second retaining wall blocks disposed at intervals sequentially, first gaps extending in a direction away from the display area are formed between any two adjacent ones of the plurality of first retaining wall blocks, second gaps extending in a direction away from the display area are formed between any two adjacent ones of the plurality of second retaining wall blocks, and each of the first gaps and each of the second gaps are arranged in an alternating manner;

wherein a width of each of the first gaps reduces and a width of each of the second gaps increases in the direction away from the display area.

16. The display panel according to claim 1, wherein a distance between center of the first retaining wall array and the dam wall is e1, a distance between center of the second retaining wall array and the dam wall is e2, and a distance between edges of the display area and the dam wall is a, b1 is a width of each of the plurality of first retaining wall blocks, d1 is a length of each of the plurality of first retaining wall blocks in the direction away from the display area, and a dimension of e2 ranges from (d1/2+10) μm to a/2.

17. The display panel according to claim 16, wherein a dimension of e1-e2-d1 ranges from 5 μm to 1200 μm.

18. The display panel according to claim 16, wherein a dimension of b1 ranges from 1 μm to 1200 μm.

19. The display panel according to claim 16, wherein b2 is a width of each of the plurality of second retaining wall blocks, b2 ranges from 29 μm to 1200 μm, and b1 ranges from (b2−10 μm) to b2/2.

20. The display panel according to claim 1, wherein cl is a spacing between two adjacent ones of the plurality of first retaining wall blocks, and a dimension of cl ranges from 1 μm to 1200 μm.

* * * * *